United States Patent
Shin et al.

(10) Patent No.: US 8,654,555 B2
(45) Date of Patent: Feb. 18, 2014

(54) ROIC CONTROL SIGNAL GENERATOR

(75) Inventors: Jeong-Gyun Shin, Buelton, CA (US); Micky Harris, Lompoc, CA (US)

(73) Assignee: Raytheon Company, Waltham, MA (US)

( * ) Notice: Subject to any disclaimer, the term of this patent is extended or adjusted under 35 U.S.C. 154(b) by 73 days.

(21) Appl. No.: 13/487,697

(22) Filed: Jun. 4, 2012

(65) Prior Publication Data
US 2013/0322145 A1    Dec. 5, 2013

(51) Int. Cl.
*G11C 15/00*    (2006.01)

(52) U.S. Cl.
USPC ............ 365/49.1; 365/49.15; 365/49.16; 365/49.17

(58) Field of Classification Search
USPC ............ 365/49.1, 49.15, 49.16, 49.17
See application file for complete search history.

(56) References Cited

U.S. PATENT DOCUMENTS

| | | | |
|---|---|---|---|
| 4,264,807 A | | 4/1981 | Moen et al. |
| 5,617,348 A | * | 4/1997 | Maguire ............ 365/49.17 |
| 5,982,428 A | | 11/1999 | Charneski et al. |
| 6,785,152 B2 | * | 8/2004 | Yiu et al. ............ 365/49.1 |
| 7,242,600 B2 | * | 7/2007 | Phan et al. .......... 365/49.15 |
| 7,283,404 B2 | * | 10/2007 | Khan et al. ........ 365/189.05 |
| 7,920,398 B1 | * | 4/2011 | Khanna et al. ....... 365/49.1 |
| 2010/0047956 A1 | | 2/2010 | Sarwari |

OTHER PUBLICATIONS

Pagiamtzis, et al.; "Content-Addressable Memory (CAM) Circuits and Architectures: A Tutorial and Survey;" IEEE Journal of Solid-State Circuits; vol. 41; No. 3; Mar. 2006; pp. 712-727.

Wang, et al.; "Single Event Upset: An Embedded Tutorial;" $21^{st}$ International Conference on VLSI Design; IEEE Computer Society; Jan. 2008; pp. 429-434.

* cited by examiner

*Primary Examiner* — Pho M Luu
(74) *Attorney, Agent, or Firm* — Daly, Crowley, Mofford & Durkee, LLP

(57) ABSTRACT

A control signal generator to generate control signals for a readout integrated circuit (ROIC) includes a content addressable memory (CAM) and a random access memory (RAM). The CAM may have data stored within it that is indicative of times at which control signal switching events are to occur during generation of the control signals. The RAM may have data stored within it that is indicative of particular control signals that are to be toggled at the times indicated within the CAM.

29 Claims, 7 Drawing Sheets

ROIC CONTROL SIGNAL GENERATOR

FIELD

Subject matter disclosed herein relates generally to integrated circuits and, more particularly, to techniques for generating control signals for integrated circuits.

BACKGROUND

Readout integrated circuits (ROIC) capture images and convert them into electrical signals for later processing. Digitally generated control signals for analog circuits in ROICs typically have recurring switching patterns at regular and constant time intervals. Conventional design methodologies for ROIC controller designs rely on digital application specific integrated circuit (ASIC) design techniques using high-level hardware description languages, such as Verilog or VHDL, or custom schematic captured digital circuits, which can be costly and time consuming. ROIC controller architectures are needed that are easier to design and implement than conventional architectures. In addition, ROIC controller architectures are needed that can generate control signals in an efficient and cost effective manner.

SUMMARY

In accordance with the concepts, systems, circuits, and techniques described herein, a control signal generator to generate control signals for a readout integrated circuit (ROIC) includes a content addressable memory (CAM) having a data word input and a plurality of data storage locations at least some of which are configured to store values related to times at which control signal switching events are to take place. The CAM is configured to compare a data word on the data word input to data words stored in the plurality of data storage locations and output a match signal for a data storage location if the data word on the data word input matches data stored in the data storage location, the control signal generator further includes a counter coupled to the data word input of the CAM to generate a count value that changes with time, and a random access memory (RAM) having a plurality of data storage locations arranged in rows and columns, each row corresponding to a memory storage location of the CAM and each column corresponding to a control signal in the plurality of control signals, wherein each row of the RAM is to store data that indicates which of the plurality of control signals are to be toggled in response to that row being read enabled, wherein rows of the RAM are read enabled based on matches occurring in the CAM. In some embodiments, a static random access memory (SRAM) is used for the RAM.

With this particular arrangement, a control signal generator which can generate control signals in an efficient and cost effective manner is provided. By utilizing a CAM having values corresponding to times at which control signal events take place and a RAM having data stored therein that identifies individual control signals to is be toggled at times specified by the CAM, the control signal generator uses the CAM and RAM to generate control signals for a ROIC. This CAM/RAM approach allows a single control generator design to be configured for use with different ROICs.

In accordance with another aspect of the concepts, systems, circuits, and techniques described herein, a system to generate control signals for a readout integrated circuit (ROIC) includes a non-programmable control signal generator; a programmable control signal generator comprising a content addressable memory (CAM), a random access memory (RAM) coupled to an output of the CAM, and a counter coupled to an input of the CAM; and a selection device to controllably select either the non-programmable control signal generator or the programmable control signal generator to provide control signals for the ROIC.

In accordance with a still further aspect of the concepts, systems, circuits, and techniques described herein, a machine implemented method for use in generating control signals includes initializing a plurality of control signals; starting a counter; comparing a count value of the counter to a plurality of stored values within a content addressable memory (CAM); and if a match is detected as a result of comparing: reading data from a row of a random access memory (RAM) that corresponds to a memory location of the CAM that produced a match; and toggling one or more control signals in the plurality of control signals based on the data read from the RAM.

In accordance with still another aspect of the concepts, systems, circuits, and techniques described herein, a machine implemented method to provide control signals to a readout integrated circuit (ROIC), comprises: providing a programmable ROIC control signal generator and a non-programmable ROIC control signal generator; using the non-programmable ROIC control signal generator to provide control signals to the ROIC if ROIC performance using the non-programmable ROIC control signal generator satisfies a first condition; and using the programmable ROIC control signal generator to provide control signals to the ROIC if ROIC performance using the non-programmable ROIC control signal generator does not satisfy the first condition.

In accordance with yet another aspect of the concepts, systems, circuits, and techniques described herein, a method to program a programmable control signal generator having a content addressable memory (CAM) and a random access memory (RAM) to provide control signals to a readout integrated circuit (ROIC), comprises: loading values into storage locations of the CAM that are indicative of times at which control signal switching events are to occur for the control signals; and loading values into storage locations of the RAM that are indicative of which control signals are to be toggled at times identified within the CAM.

BRIEF DESCRIPTION OF THE DRAWINGS

The foregoing features of this invention, as well as the invention itself, may be more fully understood from the following description of the drawings in which.

DETAILED DESCRIPTION

Figure 1:
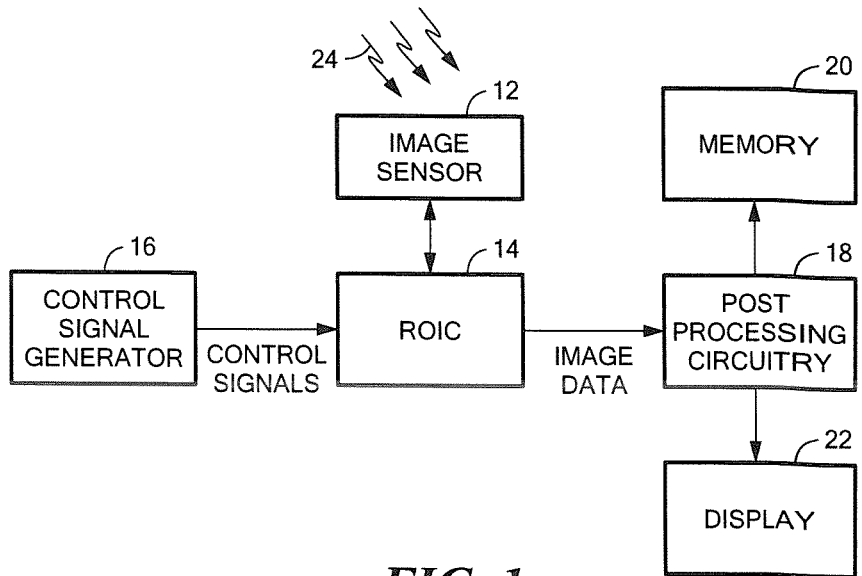
FIG. 1 is a block diagram illustrating an example imaging system that includes a ROIC in accordance with an implementation.

FIG. 1 is a block diagram illustrating an example imaging system 10 that includes a readout integrated circuit (ROIC). As shown, imaging system 10 includes: an image sensor 12, a ROIC 14, a control signal generator 16, post-processing circuitry 18, a memory 20, and a display 22. Image sensor 12 is operative for capturing an image 24 from a surrounding environment. Image sensor 12 may include any type of sensor including, for example, an infrared (IR) sensor, a visible light sensor, an ultraviolet (UV) sensor, an x-ray sensor, and/or others. ROIC 14, under the control of control signal generator 16, reads the captured image data from image sensor 12. In some cases, ROIC 14 may also perform some initial processing of the data (e.g., noise reduction processing, etc.). ROIC 14 then transfers the data to post processing circuitry 18 for further processing. The processed image data may then be delivered to memory 20 for storage and/or display 22 for display to a user.

Control signal generator 16 is operative for generating control signals for ROIC 14 to control the readout and processing of image data from image sensor 12. The control signals may include signals, such as clocks and reset signals, that may be delivered to, for example, column and row select units of the ROIC for managing the timing of the image data read operations. As will be described in greater detail, in one aspect of the concepts and techniques described herein, a control signal generator is provided that uses content addressable memory (CAM) and random access memory (RAM) to generate control signals for a ROIC. The CAM may have data stored therein that is related to the timing of switching events for the control signals. The RAM may have data stored therein that identifies individual control signals that are to be toggled at the times specified in the CAM. In some implementations, a programmable control signal generator is provided where the values stored in the CAM and/or the RAM may be changed after the control signal generator has been designed and fabricated. This feature allows a user to adjust the specifics of a control signal generation process after controller fabrication. This feature may also allow a single control signal generator design to be configured for use with different ROICs.

Figure 2:
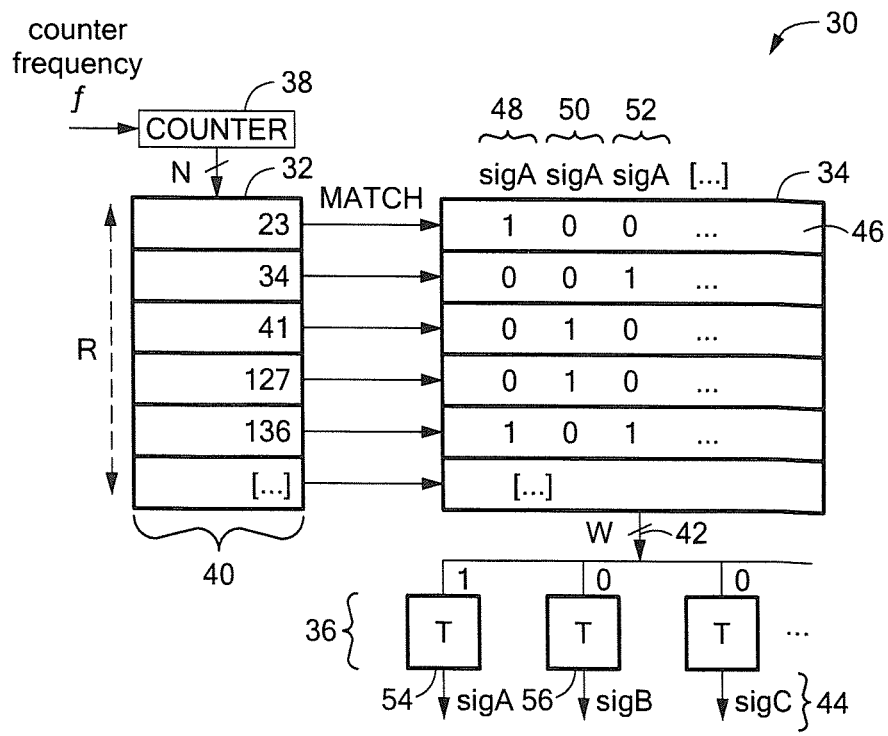
FIG. 2 is a schematic diagram illustrating an example control signal generator 30 in accordance with an implementation.

FIG. 2 is a schematic diagram illustrating an example control signal generator 30 in accordance with an embodiment. As illustrated, control signal generator 30 includes: a CAM 32, a RAM 34, a bank of toggle flip flops 36, and a counter 38. CAM 32 includes a plurality of data storage locations 40. Counter 38 is connected to a data word input of CAM 32. Each data storage location 40 of CAM 32 may be coupled to a corresponding row of RAM 34. RAM 34 has information stored therein that identifies which control signals are to be toggled or otherwise modified at corresponding times identified in CAM 32. A data output 42 of RAM 34 is coupled to the bank of toggle flip flops 36. The outputs 44 of the bank of toggle flip flops 36 may form the control signals that are being generated for the ROIC or other circuitry.

It should be appreciated that a CAM is a memory device that uses an unconventional addressing scheme. In a conventional memory device, for example, an address may be applied to the device during a read operation and the device will output data that is stored in a memory location corresponding to the applied address. In a CAM, on the other hand, a data word is input to the memory and the CAM then outputs information indicative of a storage location or locations of the CAM, if any, at which the data word is stored. In control signal generator 30 of FIG. 2, data words are stored in memory locations of CAM 32 that are indicative of the times at which switching events are to occur for the plurality of control signals 44 being generated. Each memory location of CAM 32 may include a different timing value.

Counter 38, coupled to the data word input of CAM 32, preferably counts through a series of values in a predetermined order (e.g., sequentially from zero to a maximum value, etc.). For each count value provided thereto, CAM 32 searches its entries to see if the count value is stored in any of its memory locations 40. If the count value is not stored in any of the memory locations, then CAM 32 may do nothing. If the count value of counter 38 matches a value stored in CAM 32, a match signal is generated at an output of CAM 32 associated with the memory location that includes the matching entry. The match signal may be delivered to a corresponding row read enable of RAM 34 in some implementations to enable the row for reading. Data stored within the enabled row may then be sensed by sense amplifiers of RAM 34 (not shown) and then transferred to output 42 of the device. This "read" data may then be input to the bank of toggle flip flops 36.

Any type of counter that counts through a series of values in a predetermined order may be used for counter 38 (e.g., a simple binary counter, a Gray code counter, etc.). The count does not have to be sequential. The timing values stored within CAM 32 may be selected based, at least in part, on knowledge of the count sequence of counter 38. In some implementations, a count frequency of counter 38 may be adjustable. The count frequency may be adjusted to, for example, fine tune the times at which the control signal switching events occur.

RAM 34 may include any type of RAM. In at least one embodiment, a static random access memory (SRAM) is used. As illustrated in FIG. 2, each column of RAM 34 may correspond to one of the control signals to be generated. Thus, with reference to FIG. 2, a first column 48 may correspond to signal A, a second column 50 may correspond to signal B, a third column 52 may correspond to signal C, and so on. As described above, the data stored within the rows of RAM 34 may be indicative of which control signals are to be switched (e.g., toggled) at a corresponding time identified in CAM 32. The data within a row of RAM 34 may be referred to as a switching vector. Each row of RAM 34 may include a number of memory cells that are each capable of storing a single bit of data. As shown in FIG. 2, a first row 46 of RAM 34 may include a logic one in first column 48, a logic zero in second column 50, and a logic zero in third column 52. When this row is enabled for reading, signal A will be toggled, but signals B and C will not. For each row of RAM 34, a different combination of signals may be specified.

Read data is output from RAM 34 at output 42. The data may be output serially or in parallel in different embodiments. The read data may then be transferred to corresponding inputs of toggle flip-flops 36. A toggle flip-flop (or T flip-flop) is a memory device that changes or toggles an output bit value when a specific signal value (e.g., a logic high, etc.) is received at an input. A toggle flip-flop will maintain its current output bit value if the specific signal value is not received at the input. Thus, with reference to FIG. 2, when a logic 1 is applied to an input of T flip-flop 54, signal A will toggle to a different binary value. However, when a logic zero is applied to the input of T flip-flop 56, signal B will maintain its present value. It should be appreciated that T flip-flops are only one type of circuit component that may be used to perform the toggling function. Other types of toggle circuits or devices may be used in other implementations.

Figure 3:
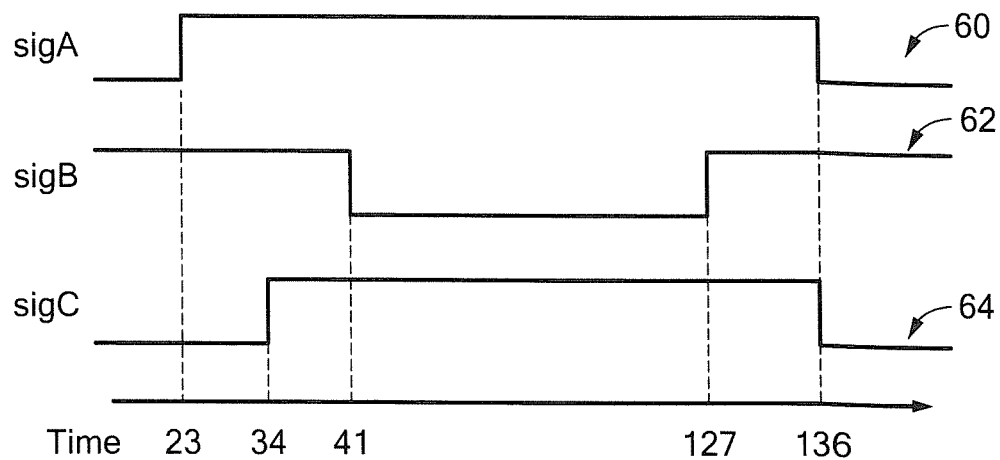
FIG. 3 is a timing diagram illustrating example control signals that may be generated in a control signal generator in accordance with an implementation.

FIG. 3 is a timing diagram illustrating three example control signals (signal A, signal B, and signal C) 60, 62, 64 that may be generated using control signal generator 30 of FIG. 2 in accordance with an implementation. Three control signals are shown in FIG. 3 to simplify illustration and improve clarity. It should be appreciated, however, that any number of control signals may be generated in a control signal generator using the principles described herein. As illustrated, the three control signals 60, 62, 64 may each be initialized to a particular binary value at the beginning of a control signal generation process. That is, signal A 60 may be initialized to logic zero, signal B may be initialized to logic one, and signal C may be initialized to a logic zero. The initializations may be performed by, for example, forcing the corresponding T flip-flops 36 to the desired initial values. After initialization, counter 38 of FIG. 2 may be activated. The three control signals 60, 62, 64 will remain at their initial values until counter 38 reaches a count value of 23. When counter 38 reaches 23, a match occurs in CAM 32 with a value stored in a first storage location thereof. A match signal is then generated, which enables the first row 46 of RAM 34. The data stored in first row 34 is then output from RAM 34 to the inputs of the bank of T flip-flops 36. As shown in FIG. 3, the logic one value stored in the first column 48 of RAM 34 causes signal A 60 to toggle from logic zero to logic one at time 23. Because logic zero values are stored in the second and third columns 50, 52 of RAM 34, signals B and C 62, 64 do not change at time 23.

Counter 38 continues to count and eventually reaches a value of 34, resulting in a match in the second row of CAM 32. This enables a second row of RAM 34 and corresponding data is output to flip-flops 36. At this time, only signal C is toggled and the other two control signals remain the same. When the counter reaches 41, signal B 62 is toggled. When the counter reaches 127, signal B 62 is again toggled. When the counter reaches 136, signal A 60 and signal C 64 are toggled, but not signal B 62. This process may continue until counter 38 reaches a predetermined value (e.g., a maximum value, a preselected value, etc.). At that point, counter 38 may be reset to zero and restarted or the signal generation process may be terminated.

In control signal generator 30 of FIG. 2, the timing values in CAM 32 are stored in sequential order. It should be appreciated that these values may be stored in any order in CAM 32 and do not need to be sequential. However, the switching vectors stored in RAM 34 must correspond to the specific times in CAM 32 to ensure that the control signals are toggled at the appropriate times. The signal delay of control signal generator 30 is dictated, in large part, by the width of CAM 32 (i.e., the number of bits per storage location, N), the depth of CAM 32 and RAM 34 (i.e., the number of rows, R, representing the number of switching events to be supported), and the width of RAM 34 (i.e., W, representing the number of control signals). The maximum number of switching events that can be supported by control signal generator 30 is $2^N$. For a given N, the size of control signal generator 30 can be grown linearly bit-slice fashion, such that up to $2^N$ rows and any number of control signals may be added.

As described previously, in some implementations, a programmable, reconfigurable control signal generator may be provided. In these implementations, the generator may be reconfigured in the field by, for example, changing one or more items of data stored within the CAM and/or the RAM. This programmability feature may permit, for example, switching time adjustment and fine tuning after chip fabrication. This may allow, for example, a single control signal generator design to be used for many different ROIC applications. Design of a control signal generator according to concepts described herein may also be much quicker and less complex than design strategies used for conventional ROIC controllers. A programmable/reconfigurable control signal generator may also provide some enhanced security features that were not available in conventional ROIC controller designs. This is because a programmable ROIC control signal generator needs to be configured with a correct binary file before the controller can function. In some implementations, this binary file may only be loaded into the control signal generator when ROIC operation is imminent.

Figure 4:
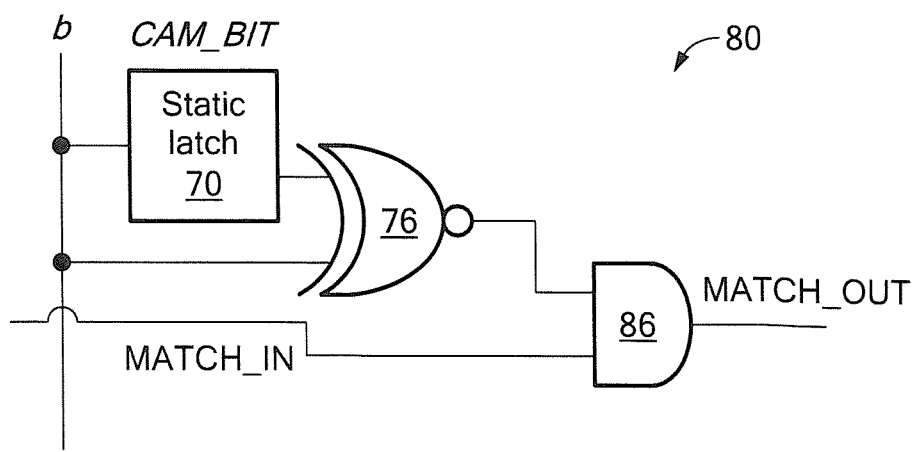
FIGS. 4, 5, and 6 are schematic diagrams illustrating example discrete combinational cell architectures that may be used for CAM and SRAM cells in a programmable ROIC control signal generator in accordance with an implementation.
Figure 5:
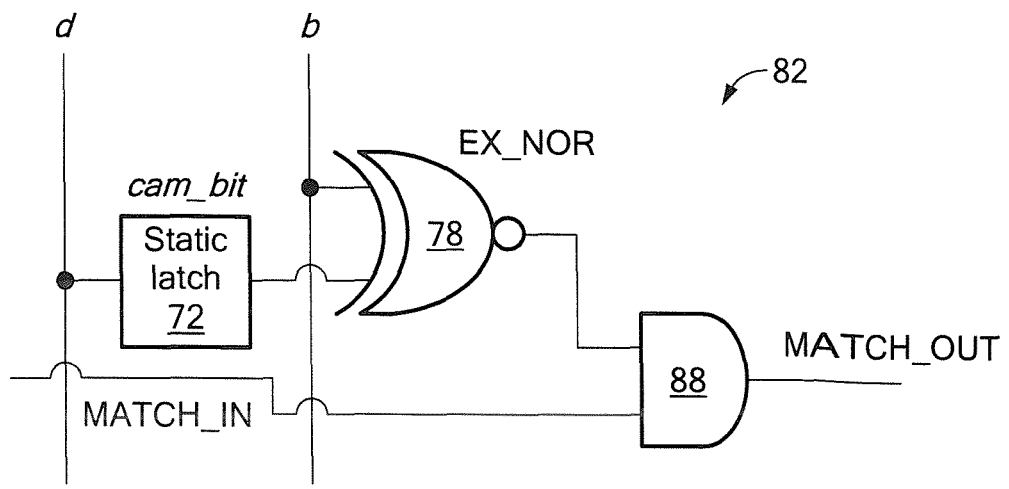
Figure 6:
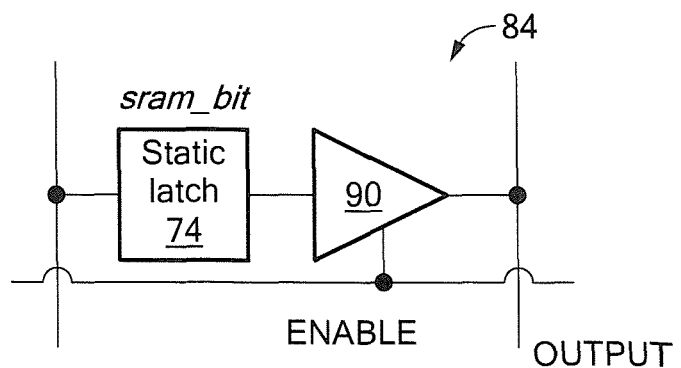

In some implementations, a control signal generator is provided that uses discrete digital cells to implement the CAM and RAM rather than using more traditional integrated circuits. Because the ROIC timing generator is typically small, and the ROIC design cycle is relatively short, a discrete digital cell approach may make sense for a fast, no-frills implementation. FIGS. 4, 5, and 6 are schematic diagrams illustrating example discrete combinational cell architectures that may be used for CAM and SRAM cells for a programmable ROIC control signal generator in an implementation. FIGS. 4 and 5 show discrete CAM cell architectures 80, 82 and FIG. 6 shows a discrete SRAM cell architecture 84. In each of the implementations, a static latch 70, 72, 74 may be used as a memory element. In the discrete CAM cell architectures 80, 82 of FIGS. 4 and 5, the static latches 70, 72 may each store a switching time bit (labeled "cam_bit"). In each case, an exclusive NOR gate 76, 78 may be provided to compare the switching time bit to a corresponding counter bit b. An output AND gate 86, 88 may also be provided to generate the output match signal. In the discrete SRAM cell architecture 84 of FIG. 6, the static latch 74 may store a switching vector bit (labeled "sram-bit"). An output buffer 90 may also be provided to couple the switching vector bit to an output when a corresponding row is enabled. One advantage of using discrete cell architectures in a ROIC control signal generator is that a designer does not have to deal with analog-flavored interfaces for data programming and match operations. That is, it can be a simpler and easier implementation of a CAM-SRAM architecture in some cases.

Figure 7:
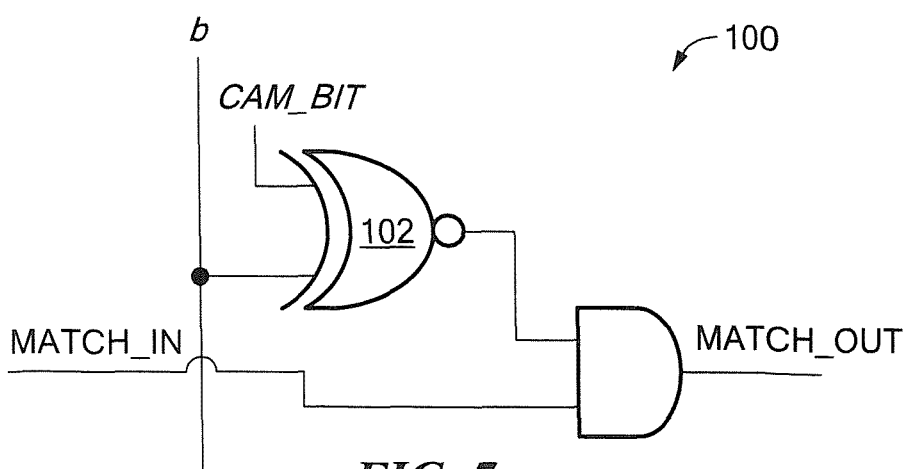
FIG. 7 is a schematic diagram illustrating an example CAM memory cell architecture that may be used in a control signal generator in accordance with an implementation.
Figures 8, 9:
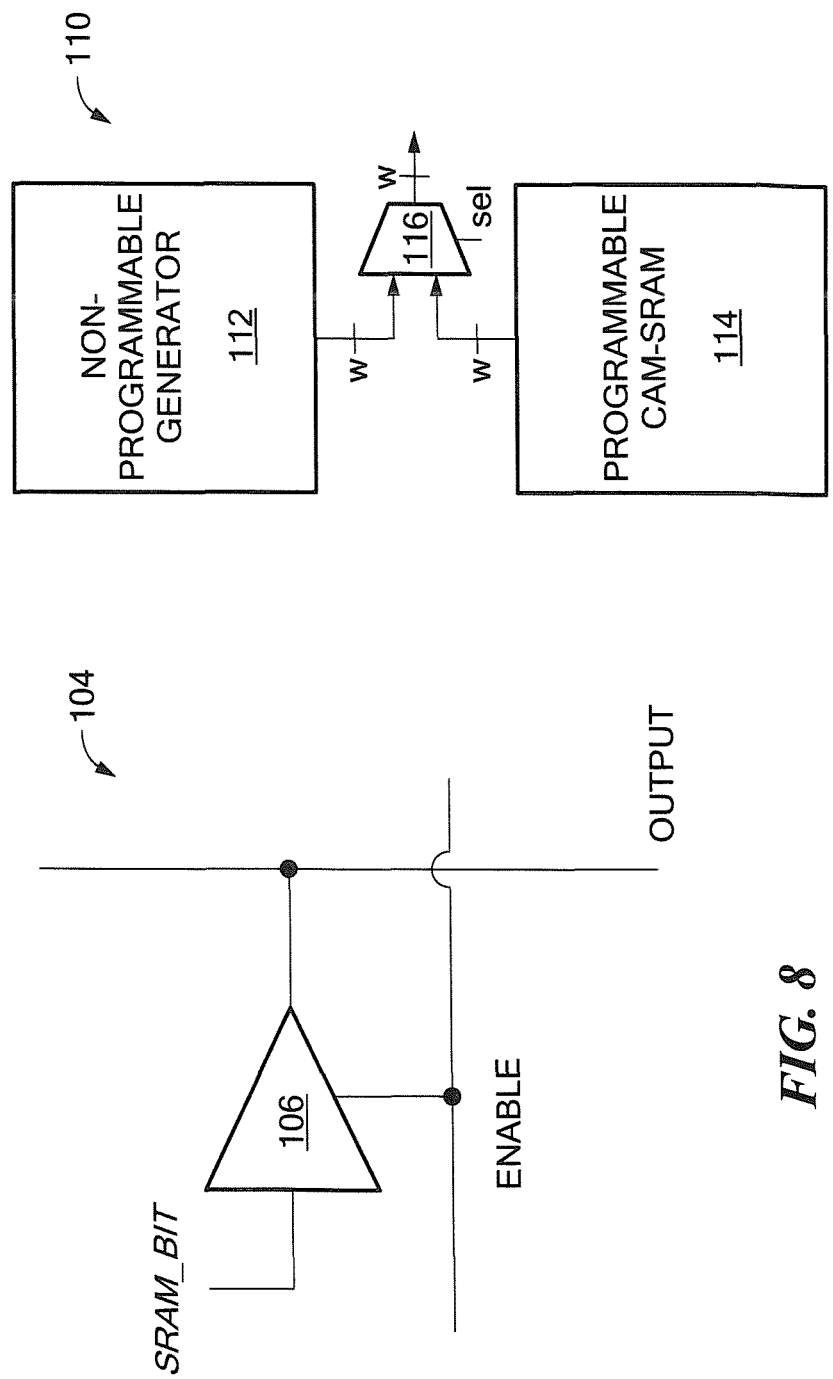
FIG. 8 is a schematic diagram illustrating an example SRAM memory cell architecture that may be used in a control signal generator in accordance with an implementation.
FIG. 9 is a block diagram illustrating an example control signal generator system that includes both a non-programmable control signal generator and a programmable control signal generator in accordance with an implementation.

In a least one embodiment, a control signal generator may be provided that uses a CAM-SRAM type architecture that is not programmable or reconfigurable. In one possible approach, for example, a control signal generator may be provided that includes hardwired memory cells. That is, the switching time bit in a CAM memory cell and the switching vector bit in a RAM memory cell may be hardwired to either a logic one or a logic zero. In some implementations, a high-level programming language script, such as Cadence SKILL, may be used to modify a circuit layout to hardwire a switching time bit or a switching vector bit to a logic one or a logic zero. FIG. 7 is a schematic diagram illustrating an example CAM memory cell 100 that may be used in a control signal generator in an implementation. As shown, CAM memory cell 100 includes an exclusive-NOR gate 102 to compare a counter bit b to a stored switching time bit (cam_bit). The switching time bit is hardwired and non-changeable. FIG. 8 is a schematic diagram illustrating an example SRAM memory cell 104 that may be used in a control signal generator in an implementation. As shown, SRAM memory cell 104 includes a buffer 106 that is hardwired to a stored switching vector bit (sram_bit). The switching vector bit is hardwired and non-changeable. Each of these memory cells 100, 104 may be used within, for example, a CAM-RAM based control signal generator (e.g., control signal generator 30 of FIG. 2, etc.) in accordance with an implementation. One possible advantage of a hardwired circuit is that it does not have to be configured every time the system is turned on. That is, the timing and switching vector information is always available in the circuitry. As used herein, the phrase "content addressable memory" and the acronym "CAM" will encompass both traditional writable CAMs as well as non-writable CAMs and partially writable CAMs such as those using cells like memory cell 100 of FIG. 7. Likewise, the phrase "random access memory" and the is acronym "RAM" will encompass both traditional writable RAMs as well as non-writable RAMs and partially writable RAMs such as those using cells like memory cell 104 of FIG. 8.

In some implementations, a CAM-SRAM based ROIC control signal generator may include some hardwired cells and some programmable cells. In some ROIC-based applications, for example, there may be some control signals for which programmability is more important than for other control signals. For example, the required timing for one control signal may be less predictable than others and frequently require adjustment after circuit fabrication. The memory cells associated with these types of signals may be made programmable, while the cells for the other signals may be hardwired.

In one possible design approach, a fully programmable ROIC control signal generator prototype may initially be designed and fabricated. After fabrication, a designer may then experiment with the timing of the prototype to obtain an optimal or near optimal ROIC performance. Then, for production chips, metal mask changes may be made to modify the programmable CAM and SRAM cells into hardcoded logic using a high-level language script. The same CAM-SRAM layout may be hard-coded differently to suit different design requirements.

FIG. 9 is a block diagram illustrating an example control signal generator system 110 that includes both a non-programmable (hardwired) control signal generator 112 and a programmable control signal generator 114 in accordance with an embodiment. The non-programmable control signal generator 112 may include a hard coded CAM-SRAM structure using cells such as those illustrated in FIGS. 7 and 8 or a more traditional ROIC controller design. The programmable control signal generator 114 may include, for example, a programmable CAM-SRAM arrangement, such as those described herein. In control signal generator system 110, non-programmable control signal generator 112 may be used to provide control signals to a ROIC as long as, for example, ROIC performance satisfies a first condition (e.g., performance remains at or above a specific threshold level, etc.). If ROIC performance does not satisfy the condition, programmable control signal generator 114 may be activated to provide control signals to the ROIC. In some situations, control signal timing modifications may be made to programmable control signal generator 114 to improve ROIC performance after activation. A multiplexer 116 may be used as a switch to controllably select the outputs of either the non-programmable control signal generator 112 or the programmable control signal generator 114 for delivery to, for example, a bank of T flip-flops or other structures to perform signal toggling for the control signals.

In control signal generator 30 of FIG. 2, there is a possibility that CAM 32 may generate two matches at the same time under certain circumstances. For example, if a user inadvertently stores the same timing value in two different storage locations of CAM 32, when the counter arrives at that timing value, two different storage locations may attempt to enable corresponding rows in RAM 34. When two or more rows of RAM 34 are enabled at the same time, problems may occur in data detection and, in some circumstances, power surges may result that can lead to chip failure. In at least one implementation, circuitry is provided to prevent simultaneous reading of two or more rows in RAM 34 when a multi-match condition occurs in CAM 32.

Figure 10:
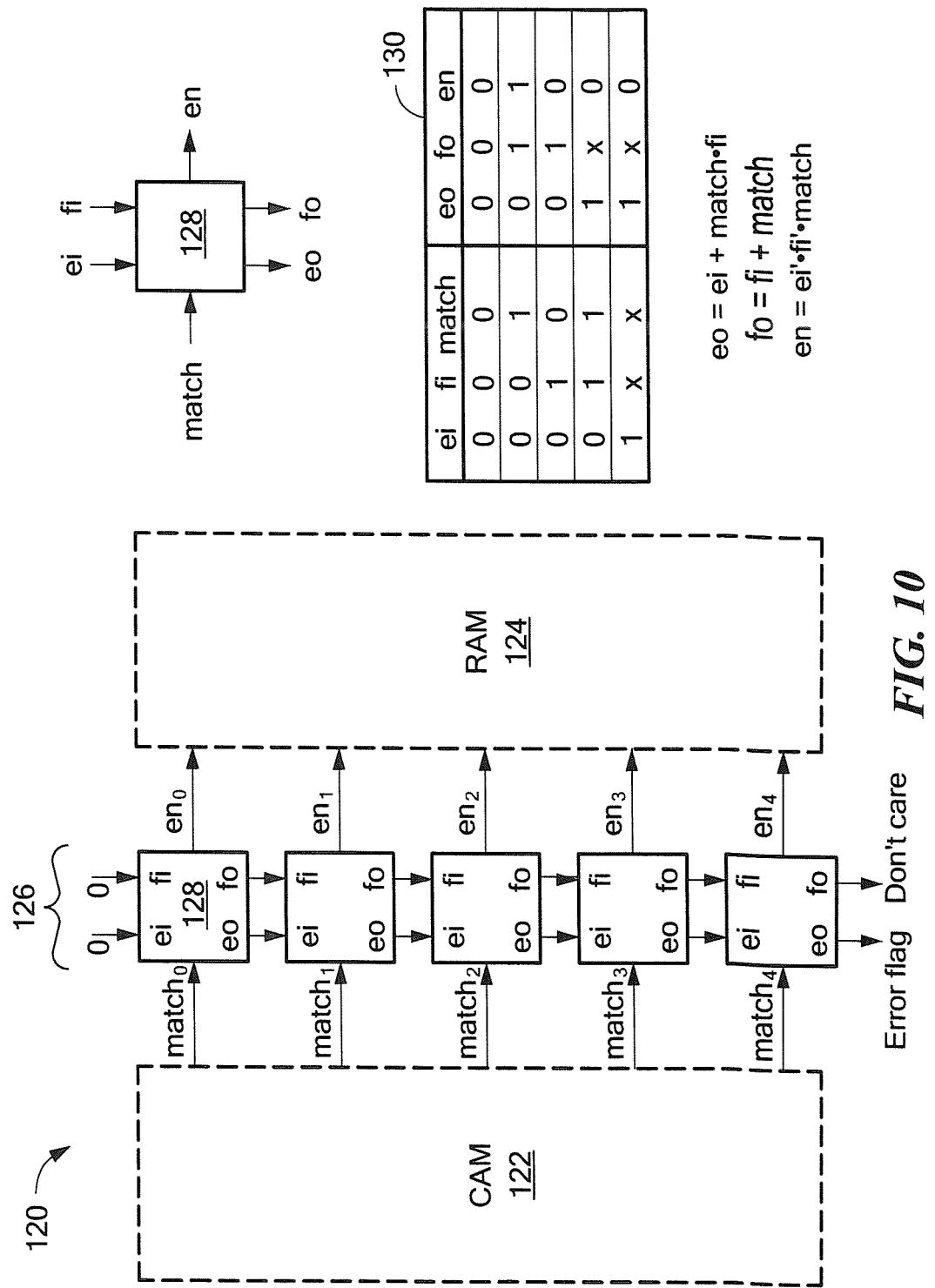
FIG. 10 is a block diagram illustrating an example control signal generator that includes circuitry for addressing multi-match conditions in a CAM in accordance with an implementation.

FIG. 10 is a block diagram illustrating an example control signal generator 120 that includes circuitry for addressing multi-match conditions in a CAM in accordance with an implementation. As illustrated, control signal generator 120 includes a CAM 122 and a RAM 124 that are similar to corresponding elements in FIG. 2. In addition, control signal generator 120 includes a plurality of interconnected encoder cells 126 disposed between CAM 122 and RAM 124 to filter the match lines before they reach RAM 124. As shown in FIG. 10, an encoder cell 128 may include three inputs and three outputs. One input receives a match signal from a corresponding memory location of CAM 122. The two other inputs receive an error signal ei and flag fi, respectively from an immediately preceding encoder cell. The match signal will be logic one if a match occurred in the corresponding memory location of CAM 122 and logic zero otherwise. The flag signal fi will be logic one if one of the preceding encoder cells (i.e., the cells above the encoder cell in FIG. 10) had a match and logic zero otherwise. The flag signal fi of an uppermost logic cell may be initialized to logic zero. The error signal ei will be logic one if two or more of the preceding encoder cells had a match and logic zero otherwise. The signal ei of an uppermost logic cell may be initialized to logic zero.

As shown in truth table 130, an enable line en at the output of an encoder cell will only be logic one if the input match line is 1 (indicating a match) and the fi signal is logic zero (indicating that none of the preceding encoder cells has a match) and the ei signal is logic zero (indicating that no error has occurred in preceding encoder cells). The output fo will be logic one if the input match line or the input fi is logic one. The output eo is logic one if the input match line and input fi are both logic one (indicating there is a multiple match, one at current encoder cell and another at a preceding encoder cell). If the input ei is logic one, the output eo will also be logic one and the output fo becomes "don't care." As shown in truth table 130, the output en will be logic one only if inputs ei and fi are logic zero and match is logic one. In this manner, no more than one read enable signal will be delivered to RAM 124 at a time. In FIG. 10, the output eo of last encoder cell is an error flag for system control use. It should be appreciated that the encoder cells described above represent one example technique that may be used to address multi-match conditions in the CAM. Other multi-match circuitry may be used in other implementations.

Figure 11:
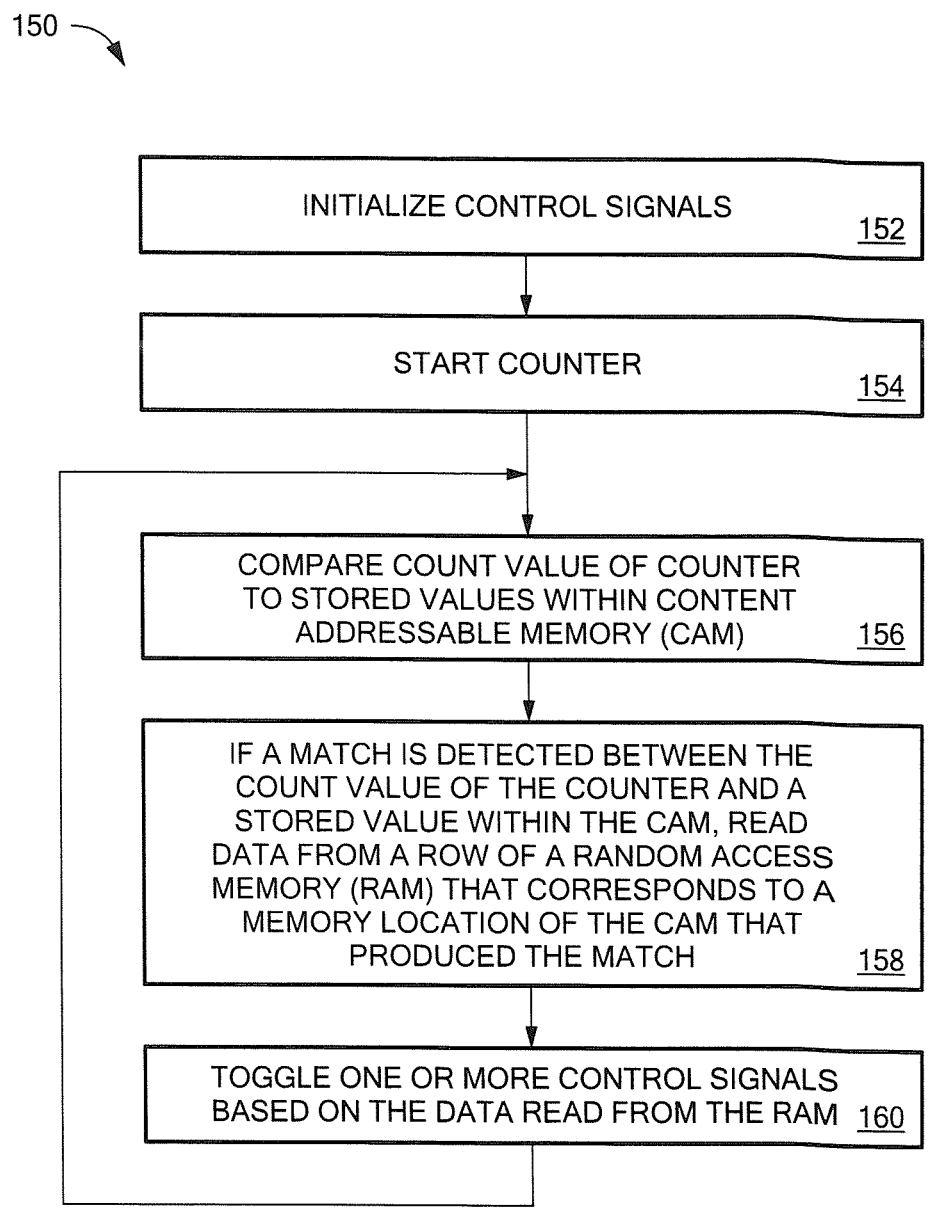
FIG. 11 is a flow chart illustrating a machine implemented method for use in generating control signals for a ROIC in accordance with an implementation.

FIG. 11 is a flow chart illustrating a machine implemented method 150 for use in generating control signals for a ROIC in accordance with an implementation. The method 150 may be used in connection with, for example, control signal generator 30 of FIG. 2 or similar devices or systems. A number of control signals may first be initialized to desired starting values (e.g., logic zero or logic one, etc.) (block 152). In some implementations, the control signals may be derived from the outputs of a series of T flip flops, so initializing the control signals may entail forcing each flip flop to a desired output state. Other techniques for initializing the control signals may alternatively be used. After the control signals have been initialized, a counter may be started (block 154). In some implementations, the counter may first be initialized to a desired value before it is started. The count value of the counter may then be compared to values stored within memory locations of a CAM (block 156). The stored values in the CAM may be related to times at which control signal switching events are to occur. If a match is detected between the count value and a stored value within the CAM, data is read from a row of a RAM that corresponds to the memory location of the CAM that produced the match (block 158). If multiple matches are detected during the comparison, multiple corresponding rows may be identified within the RAM. In at least one implementation, a single row of the RAM will be selected for reading from the multiple rows identified by the multi-match condition. As described previously, in some implementations, a plurality of interconnected encoder cells may be used to select a single row of the RAM when a multi-match condition occurs.

One or more control signals are next toggled based on the data read from the RAM (block 160). As described above, in some implementations, the control signals may be derived from the outputs of a series of T flip flops. One flip flop may be provided for each control signal. In these implementations, the toggling may be performed by delivering the read data to corresponding inputs of the T flip flops. Thus, if a logic one is delivered to a flip flop, for example, the corresponding control signal may be toggled. If a logic zero is delivered to a flip flop, the corresponding control signal may not be toggled (or vice versa). Other techniques for performing the toggling may be provided in other implementations.

Figure 12:
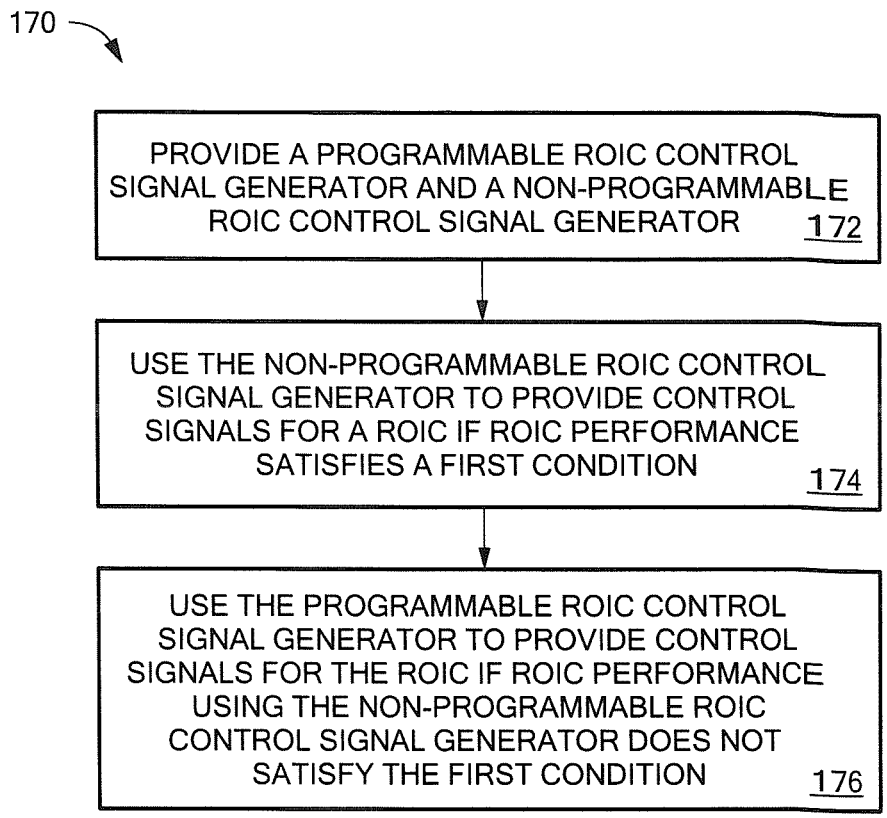
FIG. 12 is a flow chart illustrating a method for providing control signals to a ROIC in accordance with an implementation.

FIG. 12 is a flow chart illustrating a method 170 for providing control signals to a ROIC in accordance with an implementation. A control signal generation system is provided that includes both a programmable control signal generator and a non-programmable control signal generator (block 172). The programmable control signal generator may include, for example, a writable CAM, a writable RAM, and a counter. The non-programmable control signal generator may include a conventional ROIC controller or a CAM/SRAM based generator where the data is hardwired. The non-programmable control signal generator may be used to provide control signals to the ROIC as long as the ROIC performance using the non-programmable control signal generator satisfies a first condition. It may be preferable to use the non-programmable control signal generator because it does not need to be loaded with data every time the system is activated. However, if one or more of the values stored within the non-programmable generator are sub-optimal, or become sub-optimal over time, the performance of the corresponding ROIC may suffer. The programmable control signal generator may be activated to provide control signals to the ROIC if the ROIC performance using the non-programmable control signal generator does not satisfy the first condition (block 176). The programmable control signal generator may be reprogrammed if the values stored within it do not provide an adequate level of ROIC performance.

Figure 13:
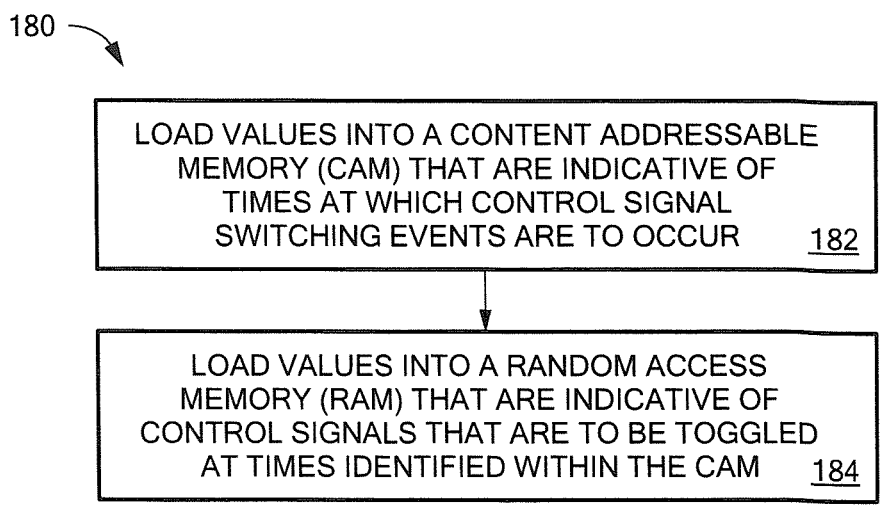
FIG. 13 is a flow chart illustrating a method for programming a programmable control signal generator having a content addressable memory (CAM) and a random access memory (RAM) to provide control signals to a readout integrated circuit (ROIC) in accordance with an implementation.

FIG. 13 is a flow chart illustrating a method 180 for programming a programmable control signal generator having a content addressable memory (CAM) and a random access memory (RAM) to provide control signals to a readout integrated circuit (ROIC) in accordance with an implementation. The method 180 may be used, for example, to program control signal generator 30 of FIG. 2 and similar circuits. Values are loaded into storage locations of the CAM that are indicative of times at which control signal switching events are to occur for the control signals (block 182). Values are loaded into storage locations of the RAM that are indicative of which control signals are to be toggled at times identified within the CAM (block 184). As described previously, there may be a one-to-one correspondence between the memory locations of the CAM and the rows of the RAM so that the timing data loaded into a particular memory location of the CAM sets the timing for the signal toggle data loaded into the corresponding row of the RAM.

In the embodiments discussed above, various controller architectures are discussed that include a content addressable memory (CAM) and a random access memory (RAM). The CAM is described as storing, or being configurable to store, data that is related to control signal timing and the RAM is described as storing, or being configurable to store, data that is related to individual control signals that are to be toggled at times specified in the CAM. It should be appreciated that, in some embodiments, additional data and/or additional storage locations may exist within a CAM or RAM that are not associated with control signal timing or control signal toggling. That is, less than all data storage locations in the CAM may be configured to store data that is related to control signal timing and less than all data storage locations in the RAM may be configured to store data that is related to individual control signals to be toggled in some implementations.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A control signal generator to generate control signals for a readout integrated circuit (ROIC), the control signal generator comprising:

a content addressable memory (CAM) having a data word input and a plurality of data storage locations, at least some of the plurality of CAM data storage locations configured to have stored therein values related to times at which control signal switching events are to take place and wherein, in response to a data word provided to the data word input, the CAM compares the data word on the data word input to data words stored in the plurality of data storage locations and, in response to the data word on the data word input matching data stored in at least one of the plurality of data storage locations, the CAM outputs a match signal at an output thereof;

a counter coupled to the data word input of the CAM to generate a count value that changes with time; and a random access memory (RAM) having a plurality of data storage locations arranged in rows and columns, at least some of the rows corresponding to memory storage locations of the CAM and at least some of the columns corresponding to individual control signals, wherein at least some of the rows of the RAM are configured to store data that indicates which of the control signals are to be toggled in response to that row being read enabled, wherein rows of the RAM are read enabled based upon matches occurring in the CAM.

2. The control signal generator of claim 1, wherein:
the RAM outputs data stored within a row when the row is read enabled; and
the control signal generator further comprises a plurality of toggle circuits to toggle the control signals based on data output from the RAM.

3. The control signal generator of claim 2, wherein:
the plurality of toggle circuits includes a plurality of toggle flip-flops.

4. The control signal generator of claim 1, wherein:
match signals output by the CAM serve as row read enable signals for corresponding rows of the RAM.

5. The control signal generator of claim 1, further comprising:
multiple match circuitry coupled between the CAM and the RAM to ensure that no more than one of the rows of the RAM are enabled if multiple matches occur in the CAM.

6. The control signal generator of claim 5, wherein:
to the multiple match circuitry includes a plurality of encoder cells arranged in a predetermined order, wherein each of the plurality of encoder cells has an input to receive a match signal from a corresponding data storage location of the CAM and an output coupled to a corresponding row enable input of the RAM, wherein each of the plurality of encoder cells will deliver a row enable signal to a corresponding row enable input of the RAM only if a match signal is received by the encoder cell from the CAM, none of the preceding encoder cells in the predetermined order have received a match signal from the CAM, and no errors have occurred in the preceding encoder cells in the predetermined order.

7. The control signal generator of claim 1, wherein:
the RAM is a static RAM (SRAM).

8. The control signal generator of claim 1, wherein:
the plurality of data storage locations of the CAM are writable.

9. The control signal generator of claim 1, wherein:
some of the data storage locations of the CAM are writable and some of the data storage locations of the CAM are non-writable.

10. The control signal generator of claim 1, wherein:
all of the data storage locations of the CAM are non-writable.

11. The control signal generator of claim 1, wherein:
the plurality of data storage locations of the RAM are writable.

12. The control signal generator of claim 1, wherein:
some of the data storage locations of the RAM are writable and some of the data storage locations of the RAM are non-writable.

13. The control signal generator of claim 1, wherein:
to all of the data storage locations of the RAM are non-writable.

14. The control signal generator of claim 1, wherein:
the CAM is implemented using discrete combinational cells.

15. The control signal generator of claim 1, wherein:
the RAM is implemented using discrete combinational cells.

16. A system to generate control signals for a readout integrated circuit (ROIC), comprising:
a non-programmable control signal generator;
a programmable control signal generator comprising a content addressable memory (CAM), a random access memory (RAM) coupled to an output of the CAM, and a counter coupled to an input of the CAM; and
a selection device to controllably select either the non-programmable control signal generator or the programmable control signal generator to provide control signals for the ROIC.

17. The system of claim 16, wherein:
the non-programmable control signal generator comprises a non-writable CAM, a non-writable RAM coupled to an output of the non-writable CAM, and a counter coupled to an input of the non-writable CAM.

18. The system of claim 16, wherein:
the selection device includes a multiplexer.

19. The system of claim 16, wherein:
the selection device selects either the non-programmable control signal generator or the programmable control signal generator based on ROIC performance when using the non-programmable control signal generator.

20. A machine implemented method for use in generating control signals, comprising:
initializing a plurality of control signals;
starting a counter;
comparing a count value of the counter to a plurality of stored values within a is content addressable memory (CAM); and
if a match is detected as a result of comparing:
reading data from a row of a random access memory (RAM) that corresponds to a memory location of the CAM that produced a match; and
toggling one or more control signals in the plurality of control signals based on the data read from the RAM.

21. The method of claim 20, further comprising:
repeating comparing, reading, and toggling each time the count value of the counter changes.

22. The method of claim 20, further comprising:
if multiple matches are detected as a result of comparing, selecting a single row of the RAM to read.

23. The method of claim 20, wherein:
toggling one or more control signals includes delivering the data read from the RAM to input ports of a plurality of T flip-flops, wherein the control signals are derived from the output signals of the T flip-flops.

24. The method of claim 20, wherein:
reading data from a row of the RAM includes sending a read enable signal to the row.

25. A machine implemented method to provide control signals to a readout integrated circuit (ROIC), comprising:
providing a programmable ROIC control signal generator and a non-programmable ROIC control signal generator;
using the non-programmable ROIC control signal generator to provide control signals to the ROIC if ROIC performance using the non-programmable ROIC control signal generator satisfies a first condition; and
using the programmable ROIC control signal generator to provide control signals to the ROIC if ROIC performance using the non-programmable ROIC control signal generator does not satisfy the first condition.

26. The method of claim 25, wherein:
the programmable ROIC control signal generator includes a content addressable memory (CAM), a random access memory (RAM) coupled to an output of the CAM, and a counter coupled to an input of the CAM.

27. The method of claim 25, wherein:
the non-programmable ROIC control signal generator includes a non-writable content addressable memory (CAM), a non-writable random access memory (RAM) coupled to an output of the non-writable CAM, and a counter coupled to an input of the non-writable CAM.

28. A method to program a programmable control signal generator having a content addressable memory (CAM) and a random access memory (RAM) to provide control signals to a readout integrated circuit (ROIC), comprising:
loading values into storage locations of the CAM that are indicative of times at which control signal switching events are to occur for the control signals; and
loading values into storage locations of the RAM that are indicative of control signals that are to be toggled at times identified within the CAM.

29. The method of claim 28, wherein:
loading values into storage locations of the RAM that are indicative of control signals that are to be toggled at times identified within the CAM includes loading values into a first row of the RAM that corresponds to a first memory location of the CAM, wherein the values loaded into the first row of the RAM identify control signals that are to be toggled at the time indicated within the first memory location of the CAM.

\* \* \* \* \*